United States Patent
Xiao

(10) Patent No.: US 12,027,463 B2
(45) Date of Patent: Jul. 2, 2024

(54) MEMORY DEVICE AND FABRICATION METHOD THEREOF

(71) Applicant: Yangtze Memory Technologies Co., Ltd., Wuhan (CN)

(72) Inventor: Liang Xiao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 458 days.

(21) Appl. No.: 17/186,314

(22) Filed: Feb. 26, 2021

(65) Prior Publication Data

US 2022/0199531 A1 Jun. 23, 2022

Related U.S. Application Data

(63) Continuation of application No. PCT/CN2020/137587, filed on Dec. 18, 2020.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76843* (2013.01); *H01L 21/76889* (2013.01); *H01L 21/76895* (2013.01); *H01L 23/5283* (2013.01); *H01L 23/53223* (2013.01); *H01L 23/53238* (2013.01); *H01L 23/53252* (2013.01); *H01L 23/53266* (2013.01); *H10B 43/27* (2023.02); *H10B 43/40* (2023.02)

(58) Field of Classification Search
CPC ............ H01L 23/535; H01L 21/76805; H01L 21/76843; H01L 21/76889; H01L 21/76895; H01L 23/5283; H01L 23/53223; H01L 23/53238; H01L 23/53252; H01L 23/53266; H01L 21/76897; H10B 43/27; H10B 43/40; H10B 43/50; H10B 43/20
See application file for complete search history.

(56) References Cited

U.S. PATENT DOCUMENTS

2009/0243115 A1 10/2009 Lee et al.
2020/0203329 A1 6/2020 Kanamori et al.
(Continued)

FOREIGN PATENT DOCUMENTS

CN 106206531 A 12/2016
CN 108695336 A 10/2018
(Continued)

OTHER PUBLICATIONS

The World Intellectual Property Organization (WIPO) International Search Report for PCT/CN2020/137587 dated Sep. 26, 2021 4 pages.

*Primary Examiner* — Farun Lu
(74) *Attorney, Agent, or Firm* — Anova Law Group, PLLC

(57) ABSTRACT

A memory device includes a memory array, disposed on a substrate of a peripheral-circuit structure; a conductive plug, extending through the memory array and connected to the peripheral-circuit structure; and a conductive pad layer, disposed over the memory array and including a plurality of conductive pads spaced apart from each other. The conductive plug protrudes into a corresponding conductive pad of the plurality of conductive pads.

20 Claims, 14 Drawing Sheets

(51) Int. Cl.
    *H01L 23/528*     (2006.01)
    *H01L 23/532*     (2006.01)
    *H10B 43/27*     (2023.01)
    *H10B 43/40*     (2023.01)

(56) References Cited

U.S. PATENT DOCUMENTS

| | | | |
|---|---|---|---|
| 2020/0258817 A1* | 8/2020 | Okina | H10B 43/40 |
| 2020/0328181 A1 | 10/2020 | Liu et al. | |
| 2020/0350320 A1 | 11/2020 | Cheng et al. | |
| 2020/0365583 A1 | 11/2020 | Or-Bach et al. | |
| 2021/0035965 A1* | 2/2021 | Mizutani | H01L 25/18 |
| 2021/0036010 A1* | 2/2021 | Sim | H10B 43/10 |
| 2021/0287986 A1* | 9/2021 | Gwon | H01L 29/1033 |

FOREIGN PATENT DOCUMENTS

| | | |
|---|---|---|
| CN | 209016047 U | 6/2019 |
| CN | 110024126 A | 7/2019 |
| CN | 110168725 A | 8/2019 |
| CN | 110291631 A | 9/2019 |
| CN | 111146202 A | 5/2020 |
| CN | 111162048 A | 5/2020 |
| CN | 111564450 A | 8/2020 |
| CN | 111681988 A | 9/2020 |
| CN | 111725218 A | 9/2020 |
| CN | 112447746 A | 3/2021 |
| WO | 2020180358 A1 | 9/2020 |

* cited by examiner

MEMORY DEVICE AND FABRICATION METHOD THEREOF

CROSS-REFERENCE TO RELATED APPLICATION

This application is a continuation of International Application No. PCT/CN2020/137587, filed on Dec. 18, 2020, the entire content of which is incorporated herein by reference.

FIELD OF THE DISCLOSURE

The present disclosure generally relates to the field of semiconductor fabrication technology and, more particularly, relates to a memory device and fabrication method thereof.

BACKGROUND

In most three-dimensional (3D) NAND architectures, peripheral circuits usually take up about 20% to 30% of the die area, lowering the NAND bit density. As 3D NAND technology continues to progress to 128 layers and above, the peripheral circuits will likely take up more than 50% of the total die area, making the increase of the integration level difficult.

In order to enable a much higher NAND bit density for 3D NAND, different architecture designs have been proposed. For example, an architecture in which the peripheral circuits that handle data input/output (I/O) and memory cell operations are processed on a separate wafer before being stacked together with an array wafer where memory cells are fabricated has been developed. After being bonded together, the two wafers are connected electrically through billions of metal VIAs (Vertical Interconnect Accesses) that are formed simultaneously across the whole wafer in one process step. In many existing designs, through silicon contacts (TSCs) are often required to make electrical connections to memory cells and peripheral circuits.

The disclosed memory device and fabrication method provide another 3D NAND architecture with separately processed array wafer and peripheral-circuit wafer. The disclosed memory device has a reduced thickness which is conducive to the miniaturization of the semiconductor structures. In addition, the fabrication method for the memory device avoids forming TSCs, thereby simplifying the fabrication process.

BRIEF SUMMARY OF THE DISCLOSURE

One aspect of the present disclosure provides a memory device. The memory device includes a memory array, disposed on a substrate of a peripheral-circuit structure; a conductive plug, extending through the memory array and connected to the peripheral-circuit structure; and a conductive pad layer, disposed over the memory array and including a plurality of conductive pads spaced apart from each other. The conductive plug protrudes into a corresponding conductive pad of the plurality of conductive pads.

Another aspect of the present disclosure provides a method for forming a memory device. The method includes providing a bonded structure. The bonded structure includes a memory array, disposed on a first substrate of a peripheral-circuit structure; and a conductive plug, extending through the memory array and connected to the peripheral-circuit structure. A portion of the conductive plug protrudes from the top surface of the memory array. The method further includes forming a conductive pad layer over the memory array. The conductive pad layer includes a plurality of conductive pads spaced apart from each other, and the portion of the conductive plug protruding from the top surface of the memory array is covered by a corresponding conductive pad of the plurality of conductive pads.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
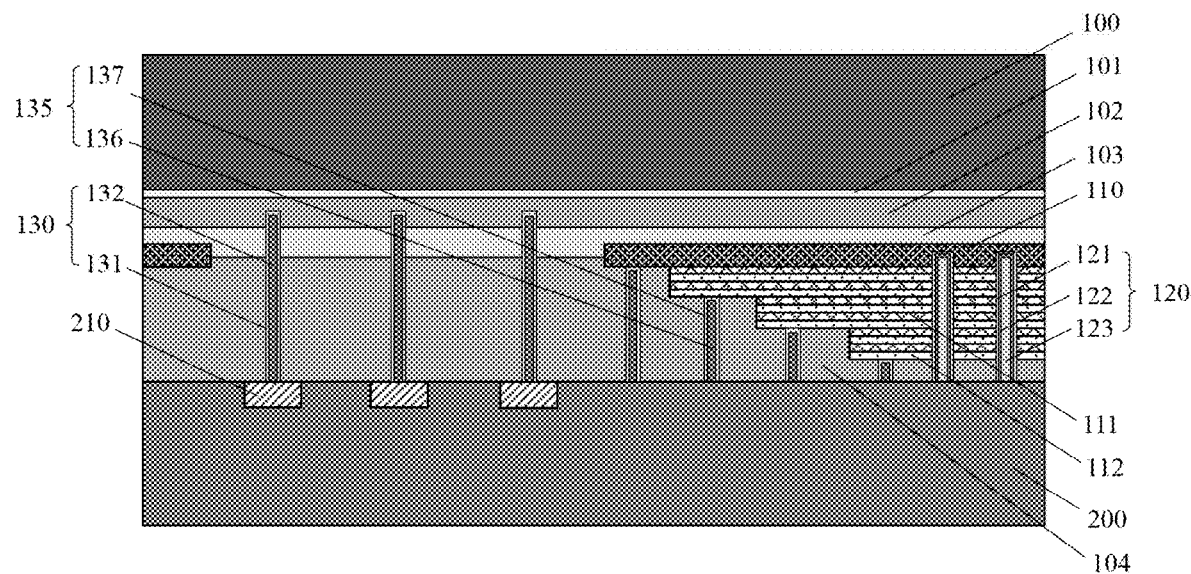
FIGS. 1-7 illustrate schematic cross-sectional views of semiconductor structures at certain stages of a method for fabricating a 3D memory device.

Reference will now be made in detail to exemplary embodiments of the invention, which are illustrated in the accompanying drawings. Wherever possible, the same reference numbers will be used throughout the drawings to refer to the same or like parts.

Although specific configurations and arrangements are discussed, it should be understood that this is done for illustrative purposes only. A person skilled in the pertinent art should recognize that other configurations and arrangements can be used without departing from the spirit and scope of the present disclosure. It will be apparent to a person skilled in the pertinent art that the present disclosure can also be employed in a variety of other applications.

It should be noted that references in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath", "below", "lower", "above", "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings", such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, the memory arrays and the peripheral circuits that handle data I/O and cell operations are process separately on different wafers, e.g. an array wafer and a peripheral-circuit wafer. After the array wafer and the peripheral-circuit wafer are bonded together, a plurality of through silicon contacts (TSCs) may be further made to electrically connect the peripheral circuits out from the back of the array wafer, and then a bottom-top metal (BTM) layer, usually made of aluminum, may be formed to connect the plurality of TSCs. In the following, an example will be provided to further illustrate the fabrication method.

FIGS. 1-7 illustrate schematic cross-sectional views of semiconductor structures at certain stages of a method for fabricating a 3D memory device.

Referring to FIG. 1, an array wafer (not labeled) and a peripheral-circuit wafer are provided. The array wafer includes a second substrate 100, a buffer layer 101 formed on a surface of the second substrate 100, a first dielectric layer 102 formed on the buffer layer 101, a second dielectric layer 103 formed on the first dielectric layer, and a conduction layer 110 formed on the second dielectric layer 103. The conduction layer 110 includes a plurality of discrete portions, such that a portion of the surface of the second dielectric layer 103 that faces away from the second substrate 100 is exposed by the conduction layer 110.

On the conduction layer 110, the array wafer includes a stack structure (not labeled) formed by a plurality of interlayer dielectric layers 111 and a plurality of conductive layers 112 (including e.g., metal layers or polycrystalline-silicon layers). The plurality of interlayer dielectric layers 111 and the plurality of conductive layers 112 are arranged alternately along a direction perpendicular to the second substrate 100. The 3D memory device to be fabricated is a 3D NAND, and correspondingly, a plurality of stairs (not labeled) is formed in the stack structure. Each stair contains one or more pairs of an interlayer dielectric layer 111 and a conductive layer 112, and a conductive layer 112 is exposed at the surface of the stair. In addition, the array wafer also includes a plurality of channels 120 formed through the stack structure. Each channel 120 further includes a charge trapping layer 121, a tunneling layer 122 and a channel layer 123.

The array wafer further includes an isolation layer 104 formed on the conduction layer 110, the second dielectric layer 103, and the stack structure. Moreover, the array wafer includes a plurality of word line contacts 135 formed through the isolation layer 104 and connected to the plurality of stairs. Each word line contact 135 includes a first adhesion layer 137 and a word-line conduction layer 136 covered by the first adhesion layer 137. The array wafer also includes a plurality of conductive plugs 130 formed through the isolation layer 104 and the second dielectric layer 130, and also partially through the first dielectric layer 102. The plurality of conductive plugs 130 are electrically connected to a plurality of peripheral circuits formed in the peripheral-circuit wafer, and each conductive plug 130 includes a second adhesion layer 131 and a conduction-plug layer 132 covered by the second adhesion layer 131.

The peripheral-circuit wafer may include a peripheral-circuit structure, including a plurality of peripheral circuits 210 formed in a first substrate 200, and a contact (not shown) of each peripheral circuit 210 is exposed at the surface of the peripheral-circuit wafer. The array wafer and the peripheral-circuit wafer are bonded together with each conductive plug 130 in contact with the exposed contact of a corresponding peripheral circuit 210. Referring to FIG. 1, the array wafer includes a front surface and a back surface with the front surface bonded to the peripheral-circuit wafer and the back surface facing away from the peripheral-circuit wafer. It should be noted that the 3D memory device may also include other components according to various 3D memory devices in existing memory technology.

Figure 2:
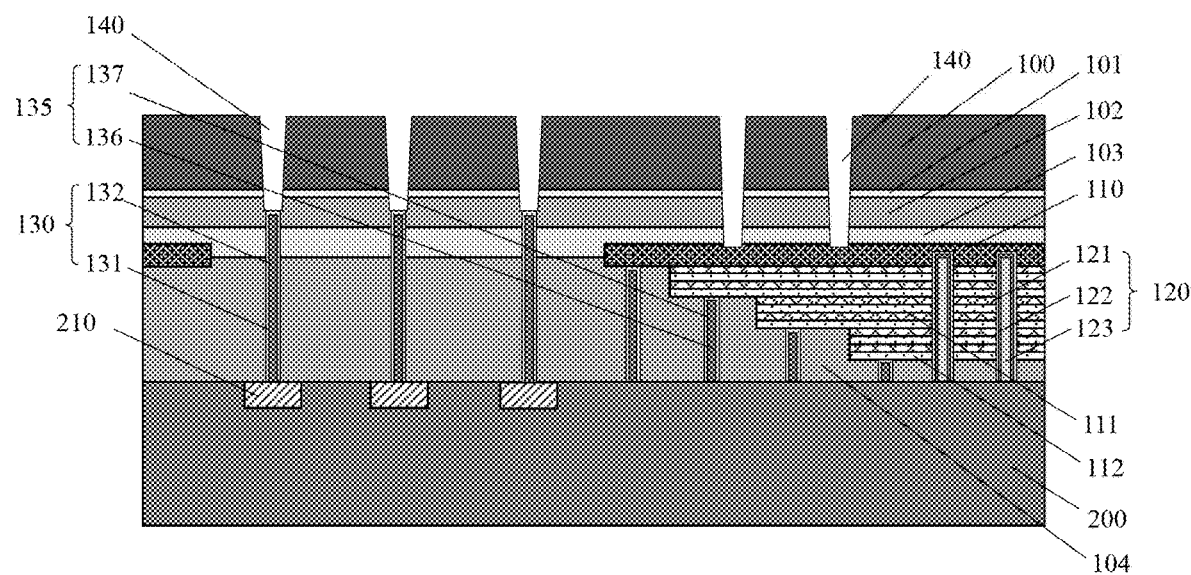

Further, referring to FIG. 2, a plurality of through holes 140 is formed from the back surface of the array substrate to expose the plurality of conductive plugs 130 and a portion of the conduction layer 110.

Figure 3:
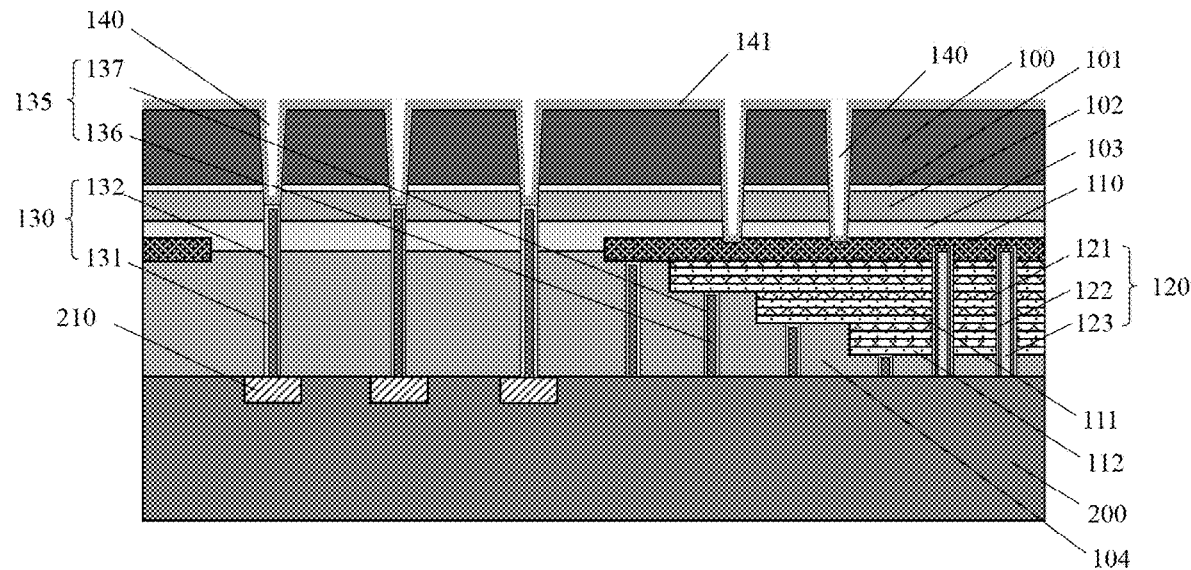

Referring to FIG. 3, after forming the plurality of through holes 140, a third adhesion layer 141 is formed on the bottom and sidewall surfaces of each through hole 140. The third adhesion layer 141 also covers the back surface of the array wafer.

Figure 4:
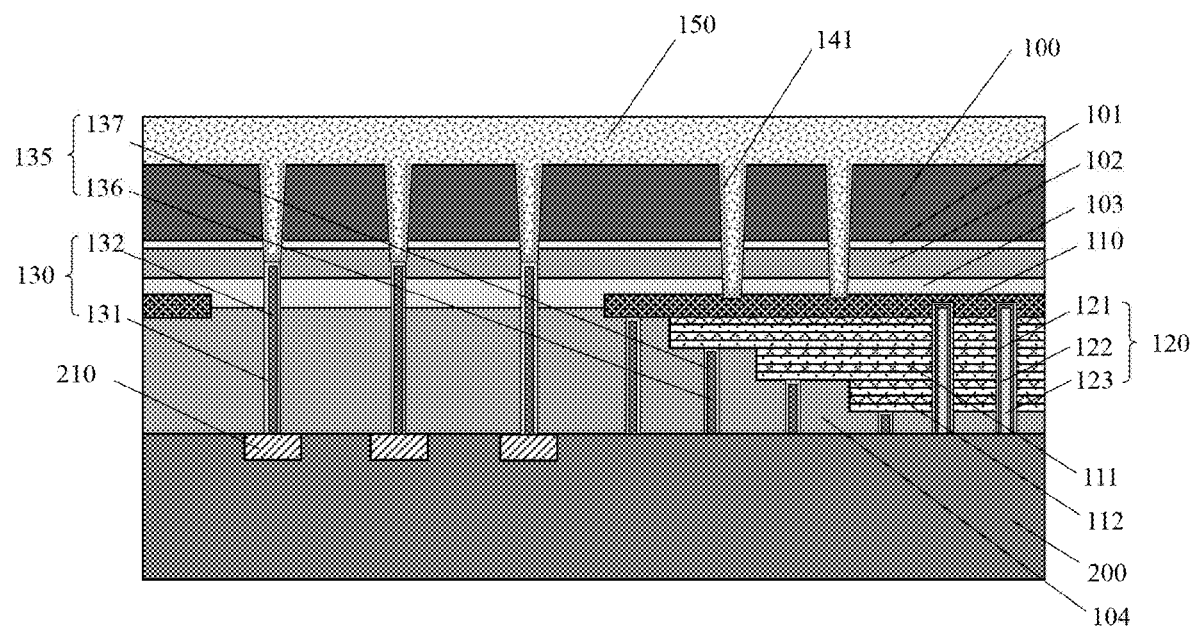

Further, referring to FIG. 4, the portion of third adhesion layer 141 formed on the back surface of the array wafer is removed, and then a conductive pad layer 150 is formed to fill the plurality of through holes 140 (referring to FIG. 3) and also cover the back surface of the array wafer. In each of the plurality of through holes 140, the third adhesion layer 141 and the conductive pad layer 150 together form a TSC (not labeled), and the TSC is electrically connected to a corresponding conductive plug 130 or the conduction layer 110.

Figure 5:
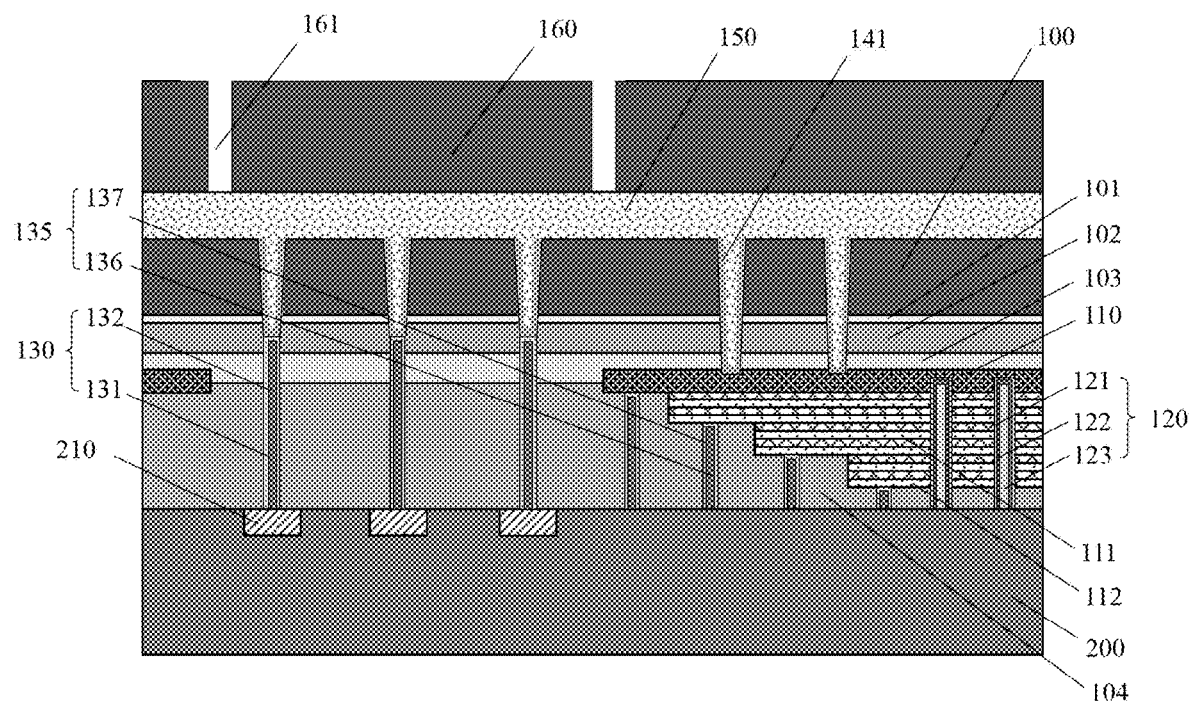

Referring to FIG. 5, a mask layer 160 is further formed on the top surface of the conductive pad layer 150, and a plurality of trenches 161 is formed through the mask layer 160 to expose a portion of the conductive pad layer 150.

Figure 6:
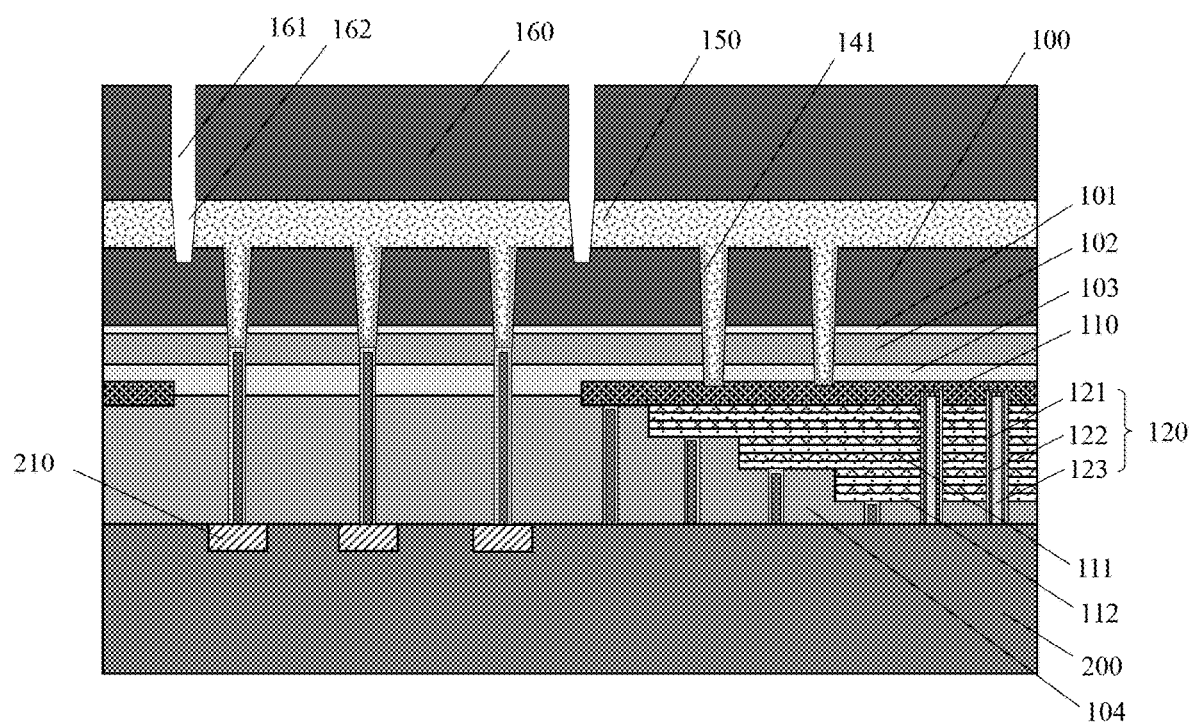

Referring to FIG. 6, the conductive pad layer 150 is then etched using the mask layer 160 as an etch mask until exposing the back surface of the array wafer. As such, the conductive pad layer 150 is defined as a plurality of discrete portions and thus forms a plurality of conductive pads (not labeled).

Figure 7:
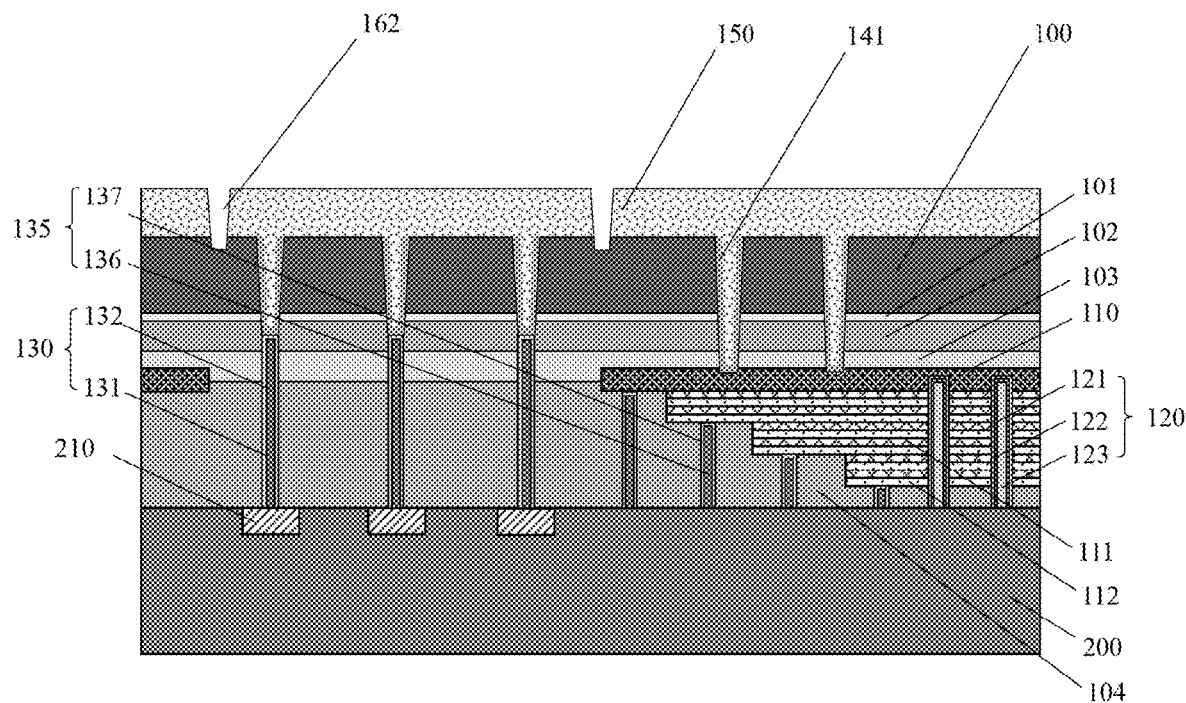

Further, referring to FIG. 7, after etching the mask layer 160 to expose the back surface of the array wafer, the mask layer 160 (referring to FIG. 6) is removed. As such, the plurality of peripheral circuits 210 formed in the peripheral-circuit wafer is electrically connected to the conductive pad layer 150 through the plurality of conductive plugs 130 and the plurality of TSCs. In addition, the conduction layer 110 is also electrically connected to the conductive pad layer 150.

According to the fabrication method described above, each peripheral circuit 210 is electrically connected to the conductive pad layer 150 via a TSC. Therefore, forming a through hole 140 (referring to FIG. 2) with a high aspect ratio is required, which may cause technical challenges during the fabrication process. In addition, because the second substrate 100 of the array wafer is not removed or partially removed, the 3D memory device formed by the method described above may have a large thickness, which may be adverse to the miniaturization of 3D memory devices.

Figure 22:
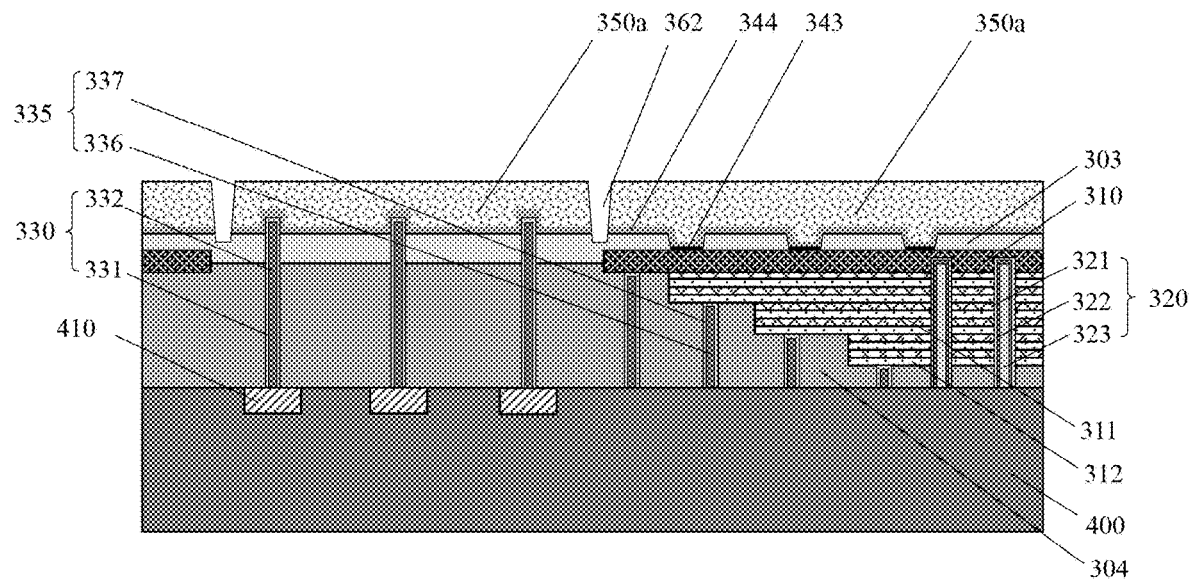
Figure 23:
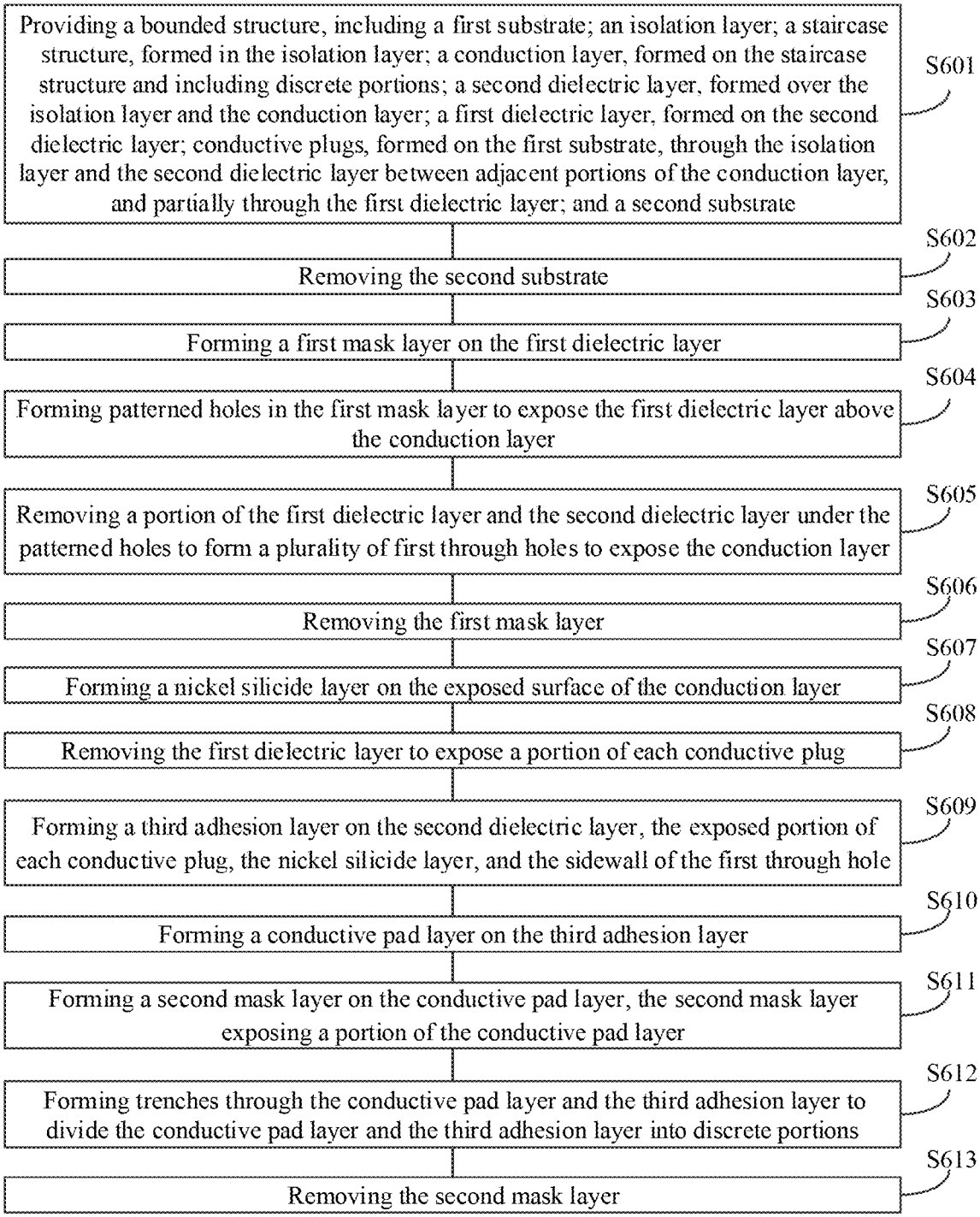
FIG. 23 illustrates a flowchart of an exemplary method for forming a memory device according to various embodiments of the present disclosure.

The present disclosure provides a memory device and a method for forming the memory device. Compared to existing fabrication method and memory device, the disclosed method simplifies the fabrication process by saving the process of forming the TSCs; in addition, the disclosed memory device has a reduced thickness, which is also conducive to the miniaturization of 3D memory devices. FIG. 23 illustrates a flowchart of an exemplary method for forming a memory device according to various embodiments of the present disclosure. FIGS. 8-22 illustrate schematic views of semiconductor structures at certain stages of the exemplary method.

Figure 8:
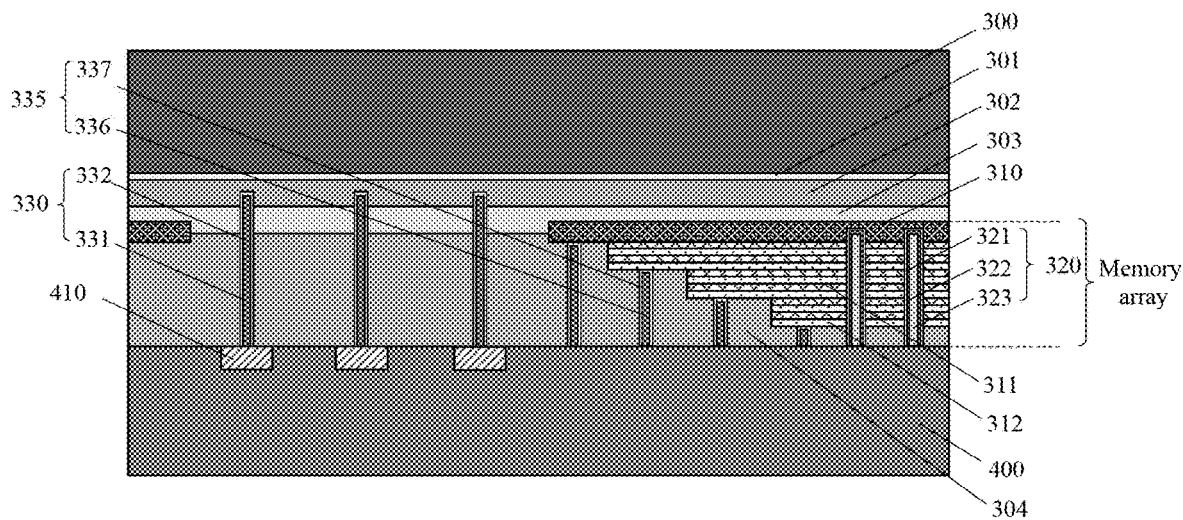
FIGS. 8-22 illustrate schematic views of semiconductor structures at certain stages of an exemplary method for fabricating a 3D memory device according to various embodiments of the present disclosure.

Referring to FIG. 23, an array wafer and a peripheral-circuit wafer may be bonded together, the array wafer including a second substrate; a buffer layer, a first dielectric layer, a second dielectric layer, and a conduction layer sequentially formed on the second substrate; a stack structure, including alternately arranged interlayer dielectric layers and conductive layers; an isolation layer formed on the conduction layer, the second dielectric layer and the stack structure; a plurality of word line contacts formed through the isolation layer and electrically connected to a plurality of stairs formed in the stack structure; and a plurality of conductive plugs formed through the isolation layer and the second dielectric layer and partially through the first dielectric layer, and the peripheral-circuit wafer including a plurality of peripheral circuits formed in a first substrate (S601). FIG. 8 illustrates a schematic cross-sectional view of a semiconductor structure consistent with various embodiments of the present disclosure.

Referring to FIG. 8, an array wafer (not labeled) and a peripheral-circuit wafer may be provided. The array wafer may include a second substrate 300, a buffer layer 301 formed on a surface of the second substrate 300, a first dielectric layer 302 formed on the buffer layer 301, a second dielectric layer 303 formed on the first dielectric layer 302, and a conduction layer 310 formed on the second dielectric layer 303. The conduction layer 310 may include a plurality of discrete portions, e.g., spaced apart from each other, such that a portion of the surface of the second dielectric layer 303 that faces away from the second substrate 300 may be exposed by the conduction layer 310.

On the conduction layer 310, the array wafer may include a stack structure (not labeled) formed by a plurality of interlayer dielectric layers 311 and a plurality of conductive layers 312. The plurality of interlayer dielectric layers 311 and the plurality of conductive layers 312 may be arranged alternately along a direction perpendicular to the second substrate 300. In one embodiment, the 3D memory device to be fabricated may be a 3D NAND, and correspondingly, a staircase structure (not labeled) including a plurality of stairs may be formed in the stack structure. Each stair may contain one or more pairs of an interlayer dielectric layer 311 and a conductive layer 312, and a conductive layer 312 may be exposed at the surface of each stair. In addition, the array wafer may also include a plurality of channels 320 formed through the stack structure. Each channel 320 may further include, from outer shell towards the center, a charge trapping layer 321, a tunneling layer 322 and a channel layer 323. In one embodiment, the charge trapping layer 321 may be made of silicon nitride, the tunneling layer 322 may be made of silicon oxide, and the channel layer 323 may be made of polycrystalline silicon.

The array wafer may further include an isolation layer 304 formed on the conduction layer 310, the second dielectric layer 303, and the stack structure. Moreover, the array wafer may include a plurality of word line contacts 335 formed through the isolation layer 304 and connected to the plurality of stairs of the staircase structure. Each word line contact 335 may include a first adhesion layer 337 and a word-line conduction layer 336 covered by the first adhesion layer 337. The array wafer may also include a plurality of conductive plugs 330 formed through the isolation layer 304, and the second dielectric layer 303, and partially through the first dielectric layer 302. The plurality of conductive plugs 330 may be used to electrically connect a plurality of peripheral circuits formed in the peripheral-circuit wafer, and each conductive plug 330 may include a second adhesion layer 331 and a conduction-plug layer 332 covered by the second adhesion layer 331.

In one embodiment, to form the plurality of conductive plugs 330, a plurality of conductive-plug holes (not shown) may need to be formed through the isolation layer 304 and the second dielectric layer 303. When forming the plurality of conductive-plug holes, the first dielectric layer 302 may serve as a stop layer.

The peripheral-circuit wafer may include a plurality of peripheral circuits 410 formed in a first substrate 400, and a contact (not shown) of each peripheral circuit 410 may be exposed at the surface of the peripheral-circuit wafer. The array wafer and the peripheral-circuit wafer may be bonded together with each conductive plug 330 in contact with the exposed contact of a corresponding peripheral circuit 410. Referring to FIG. 8, the array wafer may include a front surface and a back surface with the front surface bonded to the peripheral-circuit wafer and the back surface facing away from the peripheral-circuit wafer. It should be noted that the 3D memory device may also include other components, such as bit line contacts, etc., according to various 3D memory devices in existing memory technology.

It should be noted that as shown in FIG. 8, the memory array of the 3D memory device includes the isolation layer 304, the stack structure, the conduction layer 310, the plurality of word line contacts 335, and/or the plurality of channels 320. For example, the memory array includes a core memory-array structure. The core memory-array structure includes the plurality of channels 320 formed through the stack structure. The plurality of channels 320 is further connected to the conduction layer 310. The plurality of word line contacts 335 is formed in the isolation layer 304, and electrically connects the stairs of the staircase structure with the peripheral circuits 210 formed in the first substrate 200.

The second substrate 300 may be made of silicon, germanium, silicon germanium, or any other appropriate semiconductor material. In other embodiments, the second substrate may be made of silicon on insulator (SOI), germanium on insulator (GOI), or any other appropriate semiconductor composite. The first substrate 400 may be made of silicon, germanium, silicon germanium, or any other appropriate semiconductor material. In other embodiments, the first substrate may be made of silicon on insulator (SOI), germanium on insulator (GOI), or any other appropriate semiconductor composite. In one embodiment, the second substrate 300 and the first substrate 400 may both be made of silicon.

In one embodiment, the buffer layer 301 may be made of silicon oxide, the first dielectric layer 302 may be made of silicon nitride, the second dielectric layer 303 may be made of silicon oxide, the conduction layer 310 may be made of polycrystalline silicon, and the isolation layer 304 may be made of an oxide material, such as silicon oxide. In other embodiments, the first dielectric layer may be directly formed on the second substrate without having a buffer layer formed between.

In one embodiment, the plurality of interlayer dielectric layers 311 may be made of silicon oxide and the plurality of conductive layers 312 may be made of tungsten. In one embodiment, the charge trapping layer 321 may be made of silicon nitride, the tunneling layer 322 may be made of silicon oxide, and the channel layer 323 may be made of polycrystalline silicon. In one embodiment, the first adhesion layer 337 may be made of titanium nitride ($TiN_x$), tantalum nitride ($TaN_x$), or a combination thereof; and the word-line conduction layer 336 may be made of a metal, including tungsten (W), copper (Cu), cobalt (Co), aluminum (Al), titanium (Ti), titanium nitride ($TiN_x$), tantalum (Ta), tantalum nitride ($TaN_x$), ruthenium (Ru), or a combination thereof. In one embodiment, the second adhesion layer 331 may be made of titanium nitride ($TiN_x$), tantalum nitride ($TaN_x$), or a combination thereof; and conduction-plug layer 332 may be made of a metal, including tungsten (W), copper (Cu), cobalt (Co), aluminum (Al), titanium (Ti), titanium nitride ($TiN_x$), tantalum (Ta), tantalum nitride ($TaN_x$), ruthenium (Ru), or a combination thereof.

In one embodiment, the plurality of peripheral circuits 410 may include various types of semiconductor devices formed in the first substrate 400, and the various types of semiconductor devices (e.g., periphery devices) may be used to handle data input/output (I/O) as well as memory cell operations.

Figure 9:
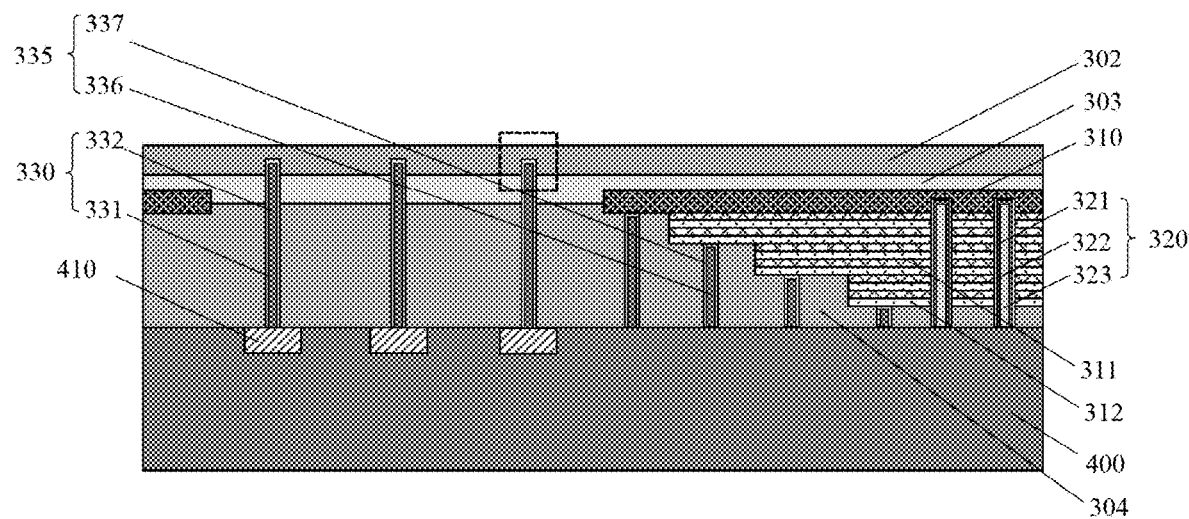

Further, returning to FIG. 23, the second substrate and the buffer layer may be removed (S602). FIG. 9 illustrates a schematic cross-sectional view of a semiconductor structure consistent with various embodiments of the present disclosure.

Referring to FIG. 9, the second substrate 300 and the buffer layer 301 formed on the second substrate 300 may be removed to expose the first dielectric layer 302. In one embodiment, the second substrate 300 and the buffer layer 301 may be removed by a chemical mechanical polishing (CMP) process.

In one embodiment, the first dielectric layer 302 may serve as a stop layer when removing the second substrate 300 and the buffer layer 301, and thus only a limited portion of the first dielectric layer 302 may be removed. In other embodiments, the second substrate may be partially removed, that is the second substrate may be thinned down. For example, a ratio of the thickness of the removed portion of the second substrate to the thickness of the entirety of the second substrate may be greater than 50%. As such, in a subsequent process, when a plurality of through holes is formed in the second substrate, the aspect ratio of the plurality of through holes may be substantially reduced, thereby reducing the difficulty of the semiconductor fabrication process.

Figure 10:
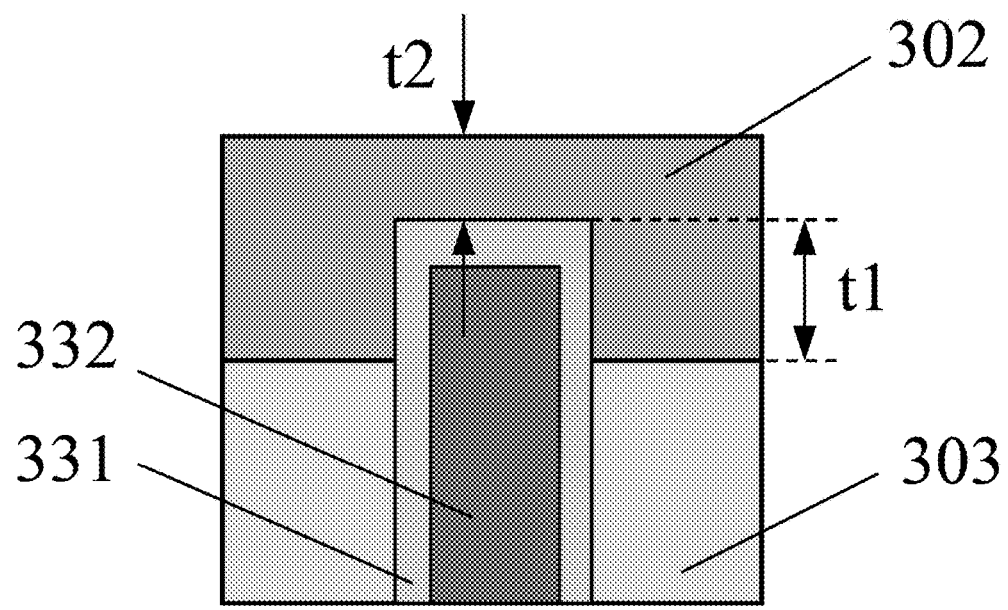

FIG. 10 illustrates a local cross-sectional view of the semiconductor structure in a squared frame shown in FIG. 9. Referring to FIG. 10, in one embodiment, each conductive plug 330 (referring to FIG. 9) may be formed partially through the first dielectric layer 302. In a subsequent process, the first dielectric layer 302 may be removed. Therefore, to ensure the morphology of the conductive plug 330, the portion of the conductive plug 330 formed in the first dielectric layer 302 may be limited. In one embodiment, a vertical distance t1 from the top surface of the second adhesion layer 331 to the interface between the first dielectric layer 302 and the second dielectric layer 303 may be less than 600 Å. Moreover, to avoid exposing or damaging the conductive plug 330, after removing the second substrate 300 and the buffer layer 301, a vertical distance t2 from the top surface of the second adhesion layer 331 to the exposed surface of the first dielectric layer 302 may be greater than 400 Å.

Figure 11:
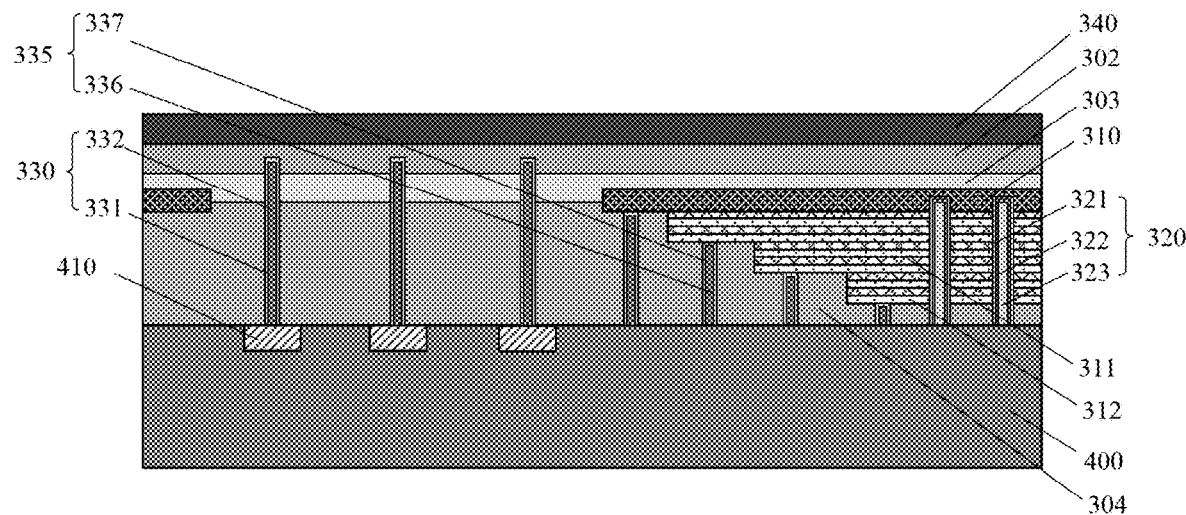

Further, returning to FIG. 23, a first mask layer may be formed on the first dielectric layer (S603). FIG. 11 illustrates a schematic cross-sectional view of a semiconductor structure consistent with various embodiments of the present disclosure.

Referring to FIG. 11, a first mask layer 340 may be formed on the first dielectric layer 302. In one embodiment, the first mask layer 340 may be made of a photoresist material. In other embodiments, the first mask layer may be made of any material that is capable of providing protection for underneath material layers when removing the first dielectric layer and the second dielectric layer in a subsequent process.

Figure 12:
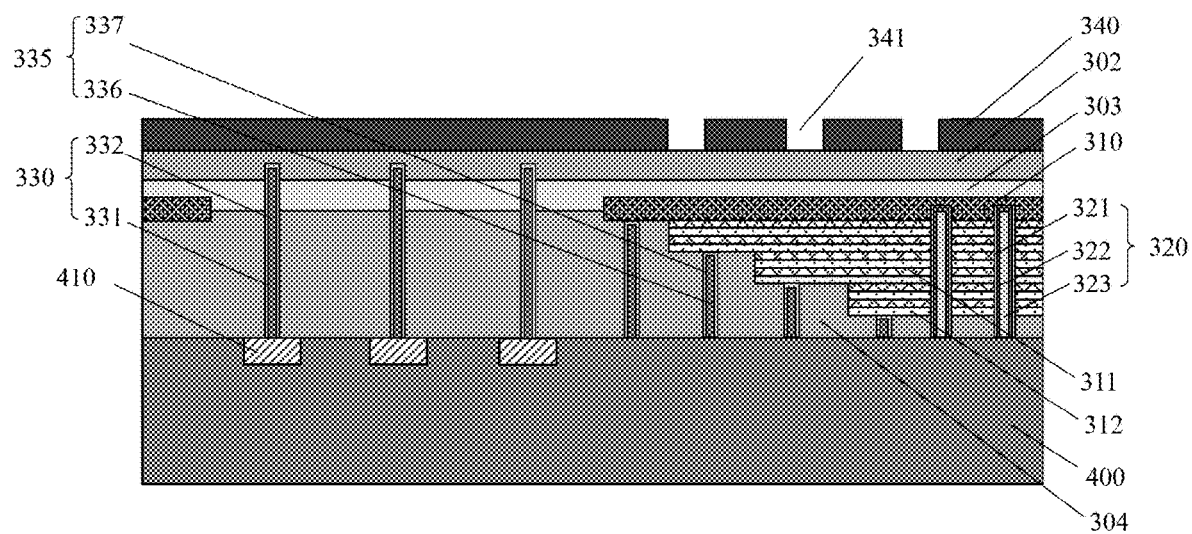

Further, returning to FIG. 23, a plurality of patterned holes may be formed in the first mask layer to expose a portion of the first dielectric layer above the conduction layer (S604). FIG. 12 illustrates a schematic cross-sectional view of a semiconductor structure consistent with various embodiments of the present disclosure.

Referring to FIG. 12, a plurality of patterned holes 341 may be formed in the first mask layer 340. The plurality of patterned holes 341 may expose a portion of the first dielectric layer 302 located vertically above the conduction layer 310.

Figure 13:
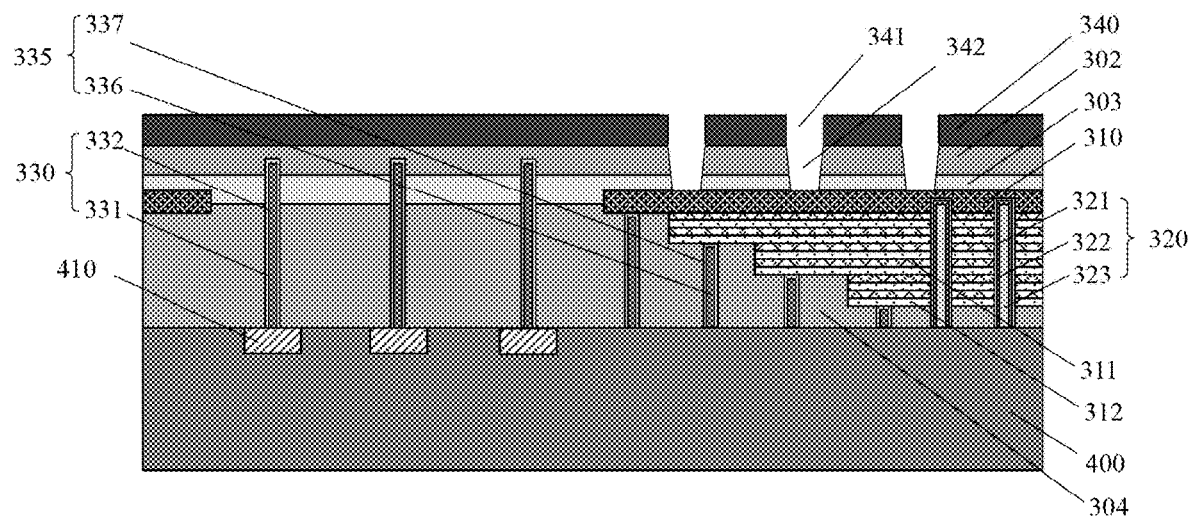

Further, returning to FIG. 23, a portion of the first dielectric layer and the second dielectric layer may be removed using the first mask layer as a mask to form a plurality of first through holes in the first dielectric layer and the second dielectric layer, the plurality of first through holes exposing the conduction layer (S605). FIG. 13 illustrates a schematic cross-sectional view of a semiconductor structure consistent with various embodiments of the present disclosure.

Referring to FIG. 13, a portion of the first dielectric layer 302 and the second dielectric layer 303 may be removed using the first mask layer 340 as a mask. After removing the portion of the first dielectric layer 302 and the second dielectric layer 303, a plurality of first through holes 342 may be formed in the first dielectric layer 302 and the second dielectric layer 303 under the plurality of patterned holes 341. The plurality of first through holes 342 may thus expose a portion of the conduction layer 310. In one embodiment, the cross-sectional profile of each first through hole 342 may have a reversed trapezoid shape.

In one embodiment, removing the portion of the first dielectric layer 302 and the second dielectric layer 303 may include a dry etching process, a wet etching process, or a process combining dry etching and wet etching.

Figure 14:
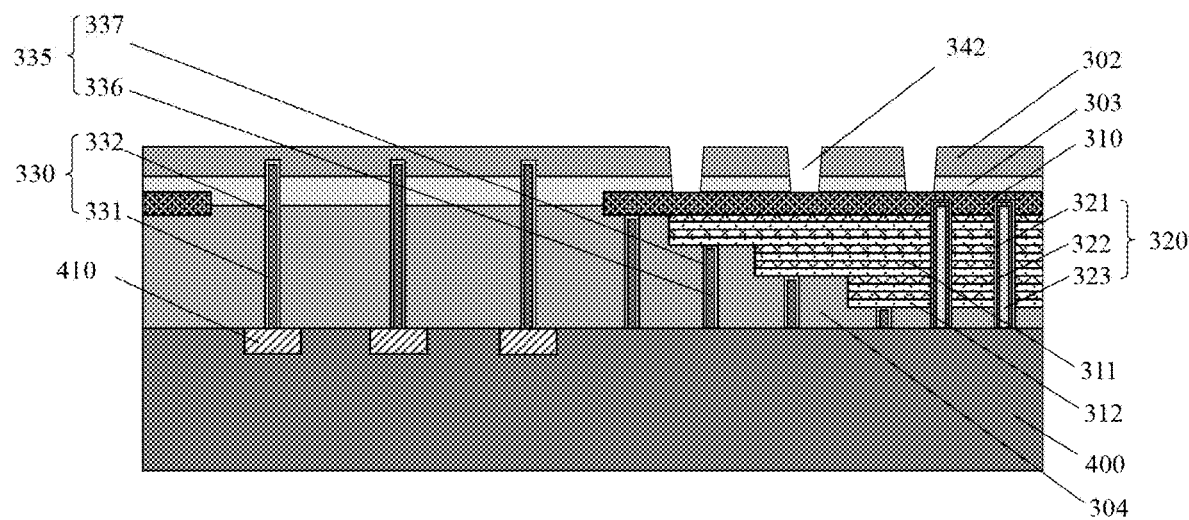

Further, returning to FIG. 23, after forming the plurality of first through holes, the first mask layer may be removed (S606). FIG. 14 illustrates a schematic cross-sectional view of a semiconductor structure consistent with various embodiments of the present disclosure.

Referring to FIG. 14, after forming the plurality of first through holes 342, the first mask layer 340 (referring to FIG. 13) may be removed. In one embodiment, the first mask layer 340 may be made of a photoresist material, and accordingly, the first mask layer 340 may be removed by a wet etching process. In other embodiments, the first mask layer may be made of a hard mask material, and accordingly, the first mask layer may be removed by an ashing process.

Figure 15:
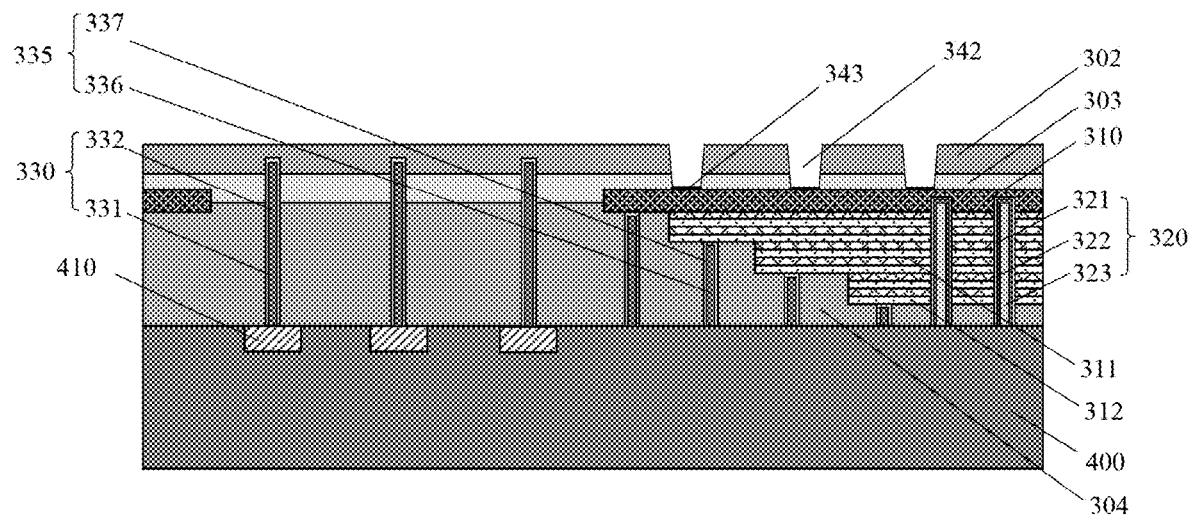

Returning to FIG. 23, further, a nickel silicide layer may be formed on the surface of the conduction layer exposed at the bottom of each first through hole (S607). FIG. 15 illustrates a schematic cross-sectional view of a semiconductor structure consistent with various embodiments of the present disclosure.

Referring to FIG. 15, a silicide layer such as a nickel silicide layer 343 may be formed on the surface of the conduction layer 310 exposed at the bottom of each first through hole 342. In one embodiment, the nickel silicide layer 343 may be formed by a nickel silicide process, and the nickel silicide process may include forming a nickel layer (not shown) on the surface of the conduction layer 310 exposed at the bottom of each first through hole 342, and performing a thermal annealing process to make the nickel layer react with the surface portion of the conduction layer 342, and thus form the nickel silicide layer 343.

In one embodiment, the annealing temperature required to form the nickel silicide layer 343 may be low such that damage to other material layers of the semiconductor structure can be avoided. For example, the annealing temperature may be below 300° C. Forming a nickel silicide layer 343 at the bottom of each first through hole 342 may be able to reduce contact resistance when an interconnection structure is subsequently formed on the nickel silicide layer 343.

It should be noted that when forming the nickel silicide layer 343 on the surface of the conduction layer 310 exposed at the bottom of each first through hole 342, because the first dielectric layer 302 covers the protruding portion of each conductive plug 330, the nickel silicide process may be prevented from affecting the conductive plug 330.

Figure 16:
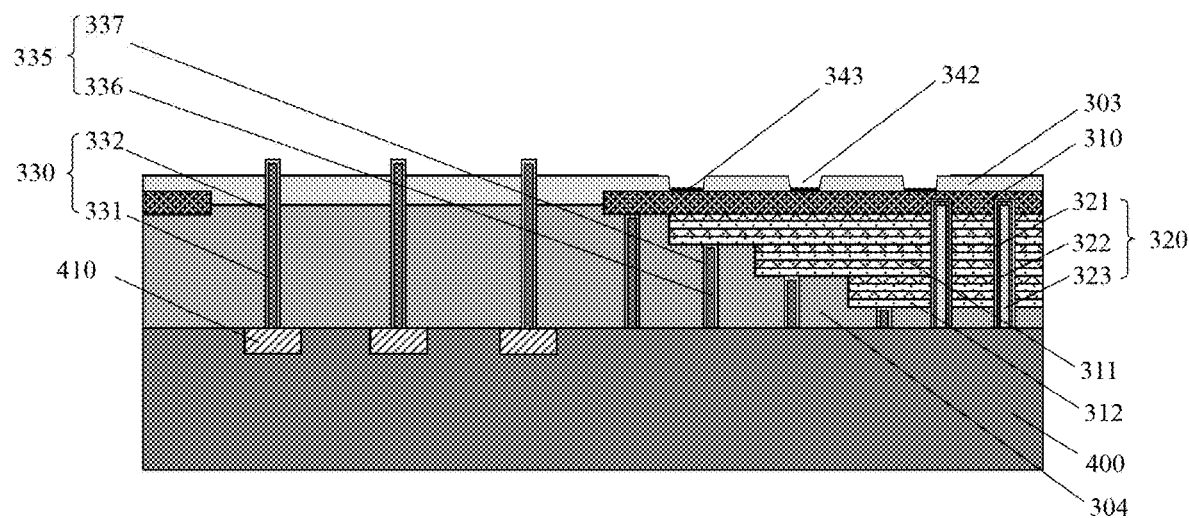

Further, returning to FIG. 23, after forming the nickel silicide layer on the conduction layer exposed in each first through hole, the first dielectric layer may be removed (S608). FIG. 16 illustrates a schematic cross-sectional view of a semiconductor structure consistent with various embodiments of the present disclosure.

Referring to FIG. 16, after forming the nickel silicide layer 343 on the conduction layer 310 exposed in each first through hole 342, the first dielectric layer 302 may be removed. The first dielectric layer 302 may be removed by a dry etching process, a wet etching process, or an etching process combining dry etching and wet etching. In one embodiment, the first dielectric layer 302 may be removed by a wet etching process. After removing the second dielectric layer 302, the plurality of conductive plugs 330 may protrude from the top surface of the second dielectric layer 303.

Figure 17:
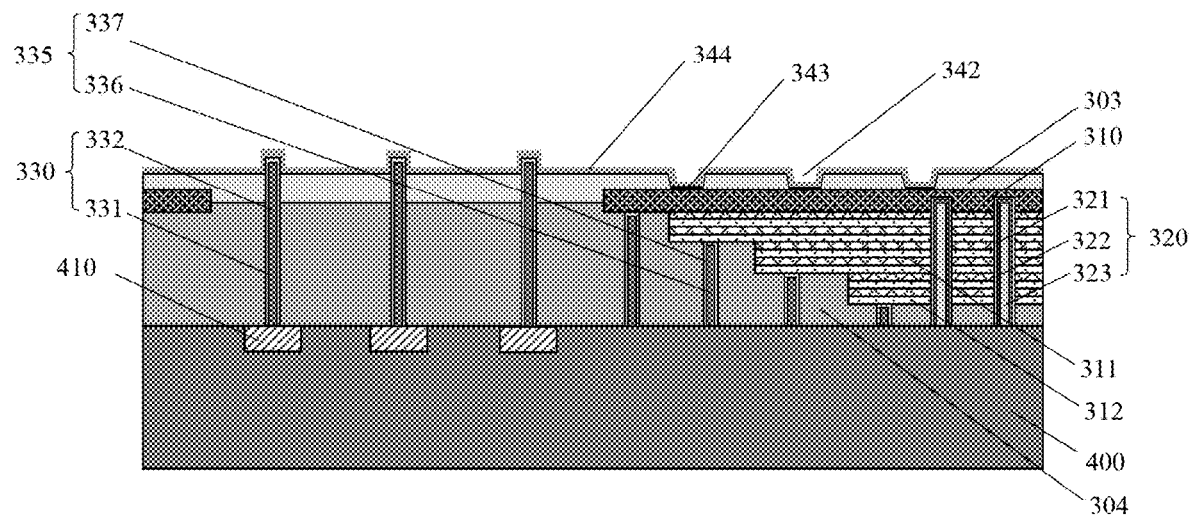

Further, returning to FIG. 23, a third adhesion layer may be formed on the top surface of the second dielectric layer, the exposed surface of the second adhesion layer, the sidewall surface of each first through hole, and the top surface of the nickel silicide layer (S609). FIG. 17 illustrates a schematic cross-sectional view of a semiconductor structure consistent with various embodiments of the present disclosure.

Referring to FIG. 17, a third adhesion layer 344 may be formed on the top surface of the second dielectric layer 303, the exposed surface of the second adhesion layer 331, the sidewall surface of each first through hole 342, and the top surface of the nickel silicide layer 343. In one embodiment, the third adhesion layer 344 may be made of titanium (Ti), and the thickness of the third adhesion layer 344 may be in a range of approximately 50 Å to 300 Å. In other embodiments, the third adhesion layer may be made of tantalum (Ta).

In one embodiment, the third adhesion layer 344 may be formed by a physical vapor deposition (PVD) process, a chemical vapor deposition (CVD) process, or an atomic layer deposition (ALD) process.

Figure 18:
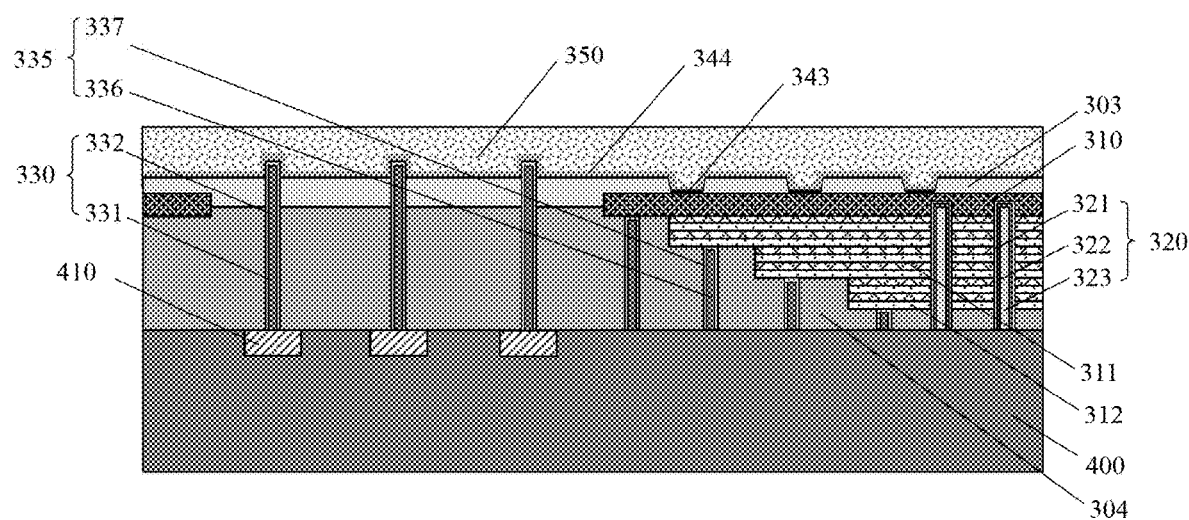

Further, returning to FIG. 23, a conductive pad layer may be formed on the third adhesion layer (S610). FIG. 18 illustrates a schematic cross-sectional view of a semiconductor structure consistent with various embodiments of the present disclosure.

Referring to FIG. 18, a conductive pad layer 350 may be formed on the third adhesion layer 344. The conductive pad layer 350 may fill each first through hole 342 (referring to FIG. 17). In one embodiment, the conductive pad layer 350 may be made of aluminum, and the thickness of the conductive pad layer 350 may be in a range of approximately 3000 Å to 10000 Å.

Figure 19:
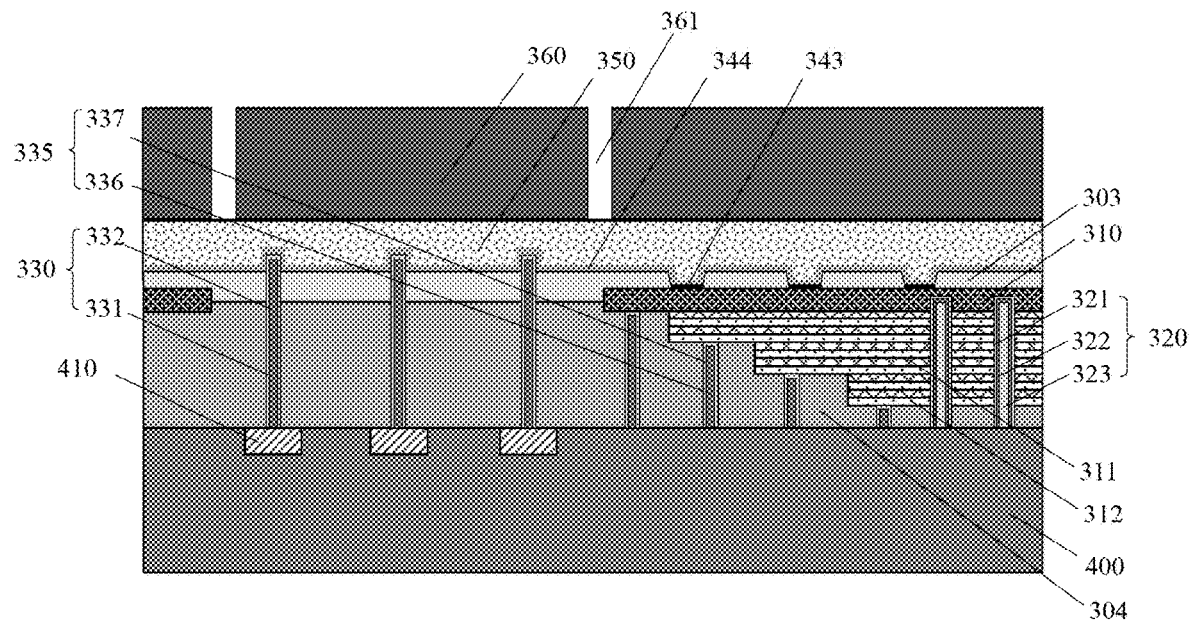

Further, returning to FIG. 23, a second mask layer may be formed on the conductive pad layer, a plurality of patterned trenches may be formed in the second mask layer to expose a portion of the conductive pad layer (S611). FIG. 19 illustrates a schematic cross-sectional view of a semiconductor structure consistent with various embodiments of the present disclosure.

Referring to FIG. 19, a second mask layer 360 may be formed on the conductive pad layer 350. A plurality of patterned trenches 361 may be formed in the second mask layer 360 to expose a portion of the conductive pad layer 350. In one embodiment, the second mask layer 360 may be made of a photoresist material. In other embodiments, the second mask layer 360 may be made of a hard mask material. In one embodiment, the plurality of patterned trenches 361 may separate the second mask layer 360 into a plurality of discrete portions.

Figure 20:
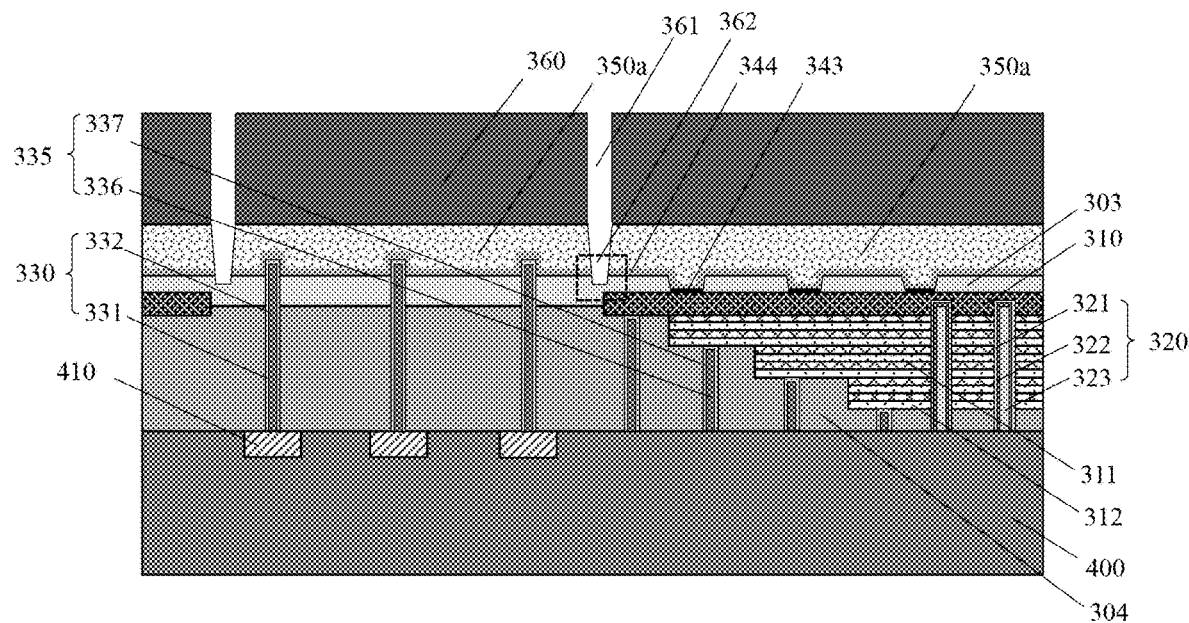
Figure 21:
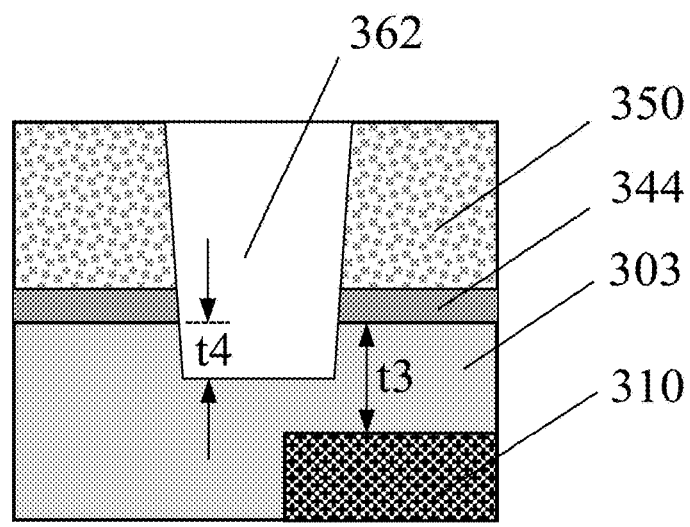

Further, returning to FIG. 23, a plurality of trenches may be formed through the conductive pad layer and the third adhesion layer to divide the conductive pad layer and the third adhesion layer into a plurality of discrete portions to form a plurality of conductive pads (S612). FIG. 20 illustrates a schematic cross-sectional view of a semiconductor structure consistent with various embodiments of the present disclosure. FIG. 21 illustrates a local cross-sectional view of the semiconductor structure in a squared frame shown in FIG. 20.

Referring to FIG. 20, a plurality of trenches 362 may be formed through the conductive pad layer 350 and the third adhesion layer 344. The plurality of trenches 362 may be partially formed through the second dielectric layer 303. As such, the plurality of trenches 362 may divide the conductive pad layer 350 and the third adhesion layer 344 into a plurality of discrete portions, which is referred to as a plurality of conductive pads 350a.

Referring to FIG. 21, in one embodiment, the thickness of the portion of the second dielectric layer 303 located on the conduction layer 310 may be in a range of approximately 1500 Å to 3000 Å (e.g., 2000 Å). That is, a distance t3 from the top surface of the conduction layer 310 to the top surface of the second dielectric layer 303 may be in a range of approximately 1500 Å to 3000 Å. In order to ensure that the trench 362 is formed through the third adhesion layer 344, the depth of the portion of the trench 362 formed in the second dielectric layer 303 may be more than 100 Å. That is, a distance t4 from the bottom of each trench 362 to the top surface of the second dielectric layer 303 may be larger than 100 Å. However, in order to avoid forming the trench 362 into the conduction layer 310, the depth of the portion of the trench 362 formed in the second dielectric layer 303 may be less than 1000 Å. That is, the distance t4 from the bottom of each trench 362 to the top surface of the second dielectric layer 303 may be smaller than 1000 Å. Therefore, in one embodiment, the distance t4 from the bottom of each trench 362 to the top surface of the second dielectric layer 303 may be in a range of approximately 100 Å to 1000 Å.

Further, returning to FIG. 23, after forming the plurality of trenches to divide the conductive pad layer and the third adhesion layer into a plurality of discrete portions to provide a plurality of conductive pads, the second mask layer may be removed (S613). FIG. 22 illustrates a schematic cross-sectional view of a semiconductor structure consistent with various embodiments of the present disclosure.

Referring to FIG. 22, after forming the plurality of trenches 362 to divide the conductive pad layer 350 and the third adhesion layer 344 into a plurality of discrete conductive pads 350a, the second mask layer 360 (referring to FIG. 20) may be removed. The plurality of conductive pads 350a may be isolated from each other. In one embodiment, the second mask layer 360 may be made of a photoresist material, and accordingly, the second mask layer 360 may be removed by a wet etching process. In other embodiments, the second mask layer may be made of a hard mask material, and accordingly, the second mask layer may be removed by an ashing process.

As such, the conductive pad layer 350, the third adhesion layer 344, and the plurality of conductive plugs 330 may together form electrical connections to the plurality of peripheral circuits 410 that is disposed in the first substrate 400. In addition, the conductive pad layer 350, the third adhesion layer 344, and the nickel silicide layer 343 may together form electrical connections to the conduction layer 310. Therefore, according to the disclosed fabrication method of memory device, the substrate of the array wafer is removed after wafer bonding, and thus forming TSCs may be unnecessary for pad-out processing. As such, the fabrication process may be simplified.

Figure 24:
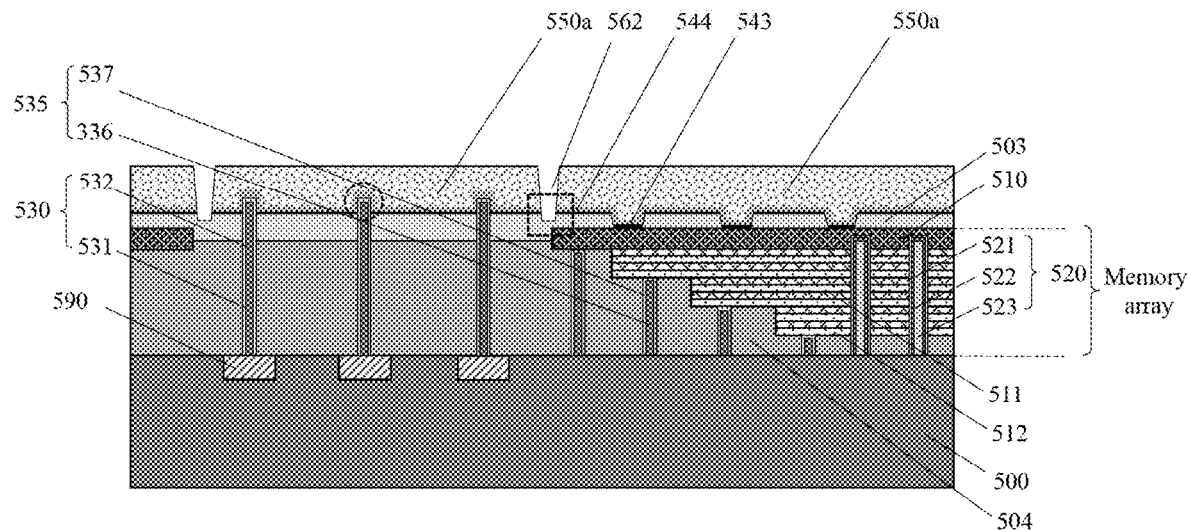
FIG. 24 illustrates a schematic cross-sectional view of an exemplary memory device according to various embodiments of the present disclosure.
Figure 25:
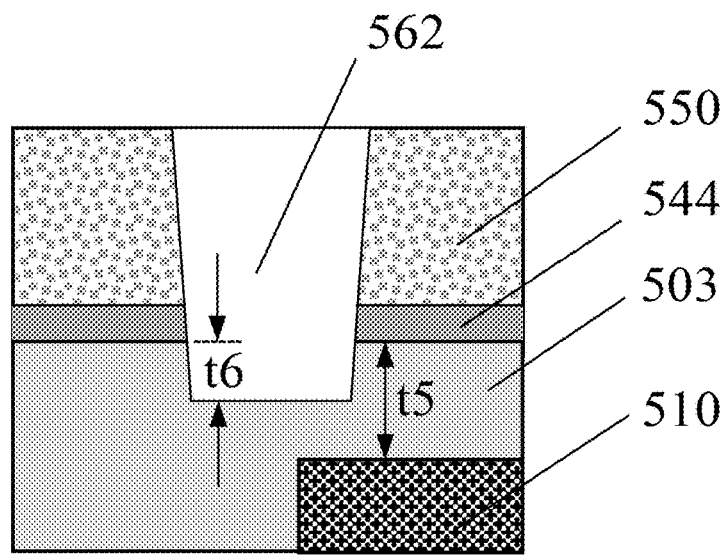
FIG. 25 illustrates a local cross-sectional view of the semiconductor structure in a squared frame shown in FIG. 24.
Figure 26:
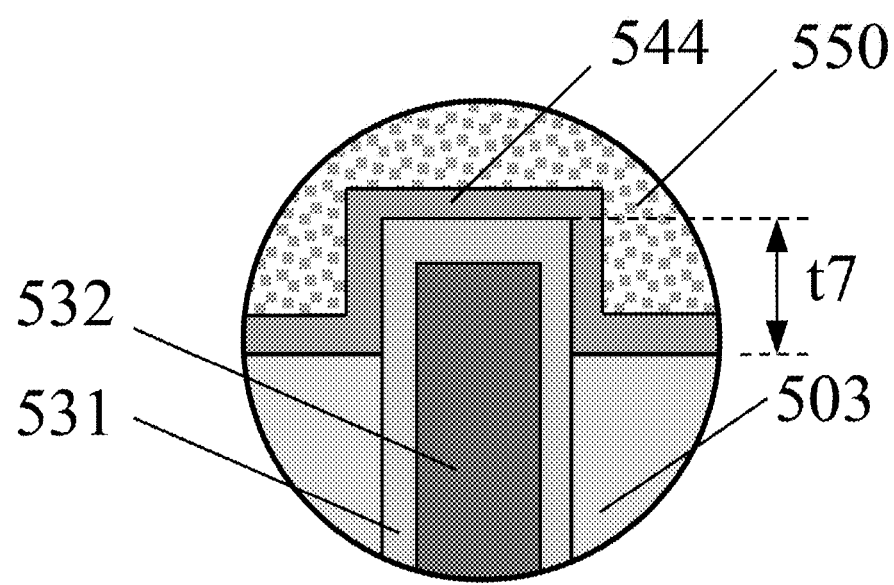
FIG. 26 illustrates a local cross-sectional view of the semiconductor structure in a circular frame shown in FIG. 24.

Correspondingly, the present disclosure also provides a memory device formed by the method according to various embodiments of present disclosure. FIG. 24 illustrates a schematic cross-sectional view of an exemplary memory device according to various embodiments of the present disclosure. FIG. 25 illustrates a local cross-sectional view of the semiconductor structure in a squared frame shown in FIG. 24, and FIG. 26 illustrates a local cross-sectional view of the semiconductor structure in a circular frame shown in FIG. 24.

Referring to FIG. 24, the memory device may include a substrate 500; a plurality of peripheral circuits 590, formed in the substrate 500; an isolation layer 504, disposed on the surface of the substrate 500; a conduction layer 510, disposed above the isolation layer 504 and including a plurality of discrete portions; and a dielectric layer 503, disposed above the conduction layer 510 and the isolation layer 504.

The dielectric layer 503 may include a plurality of first through holes (not labeled) formed through the dielectric layer 503 to expose a portion of the surface of the conduction layer 510. Further, the memory device may include a fourth adhesion layer 544 formed on the surface of the dielectric layer 503 and the sidewall and bottom surfaces of each trench formed in the dielectric layer 503. In one embodiment, the memory device may further include a nickel silicide layer 543 formed on the conduction layer 510 at the bottom of each first through hole formed in the dielectric layer 503, and accordingly, the portion of the fourth adhesion layer 544 formed on the bottom surface of each trench may be located on the nickel silicide layer 543.

The memory device may also include a conductive pad layer 550 formed on the fourth adhesion layer 544, and a plurality of trenches 562 formed through the conductive pad layer 550 and the fourth adhesion layer 544 to divide the conductive pad layer 550 and the fourth adhesion layer 544 into a plurality of discrete portions to form a plurality of conductive pads 550a. The plurality of conductive pads 550a may be isolated from each other.

Referring to FIG. 25, each trench 562 may be formed partially through the dielectric layer 503. In one embodiment, the thickness of the portion of the dielectric layer 503 located on the conduction layer 510 may be in a range of approximately 1500 Å to 3000 Å (e.g., 2000 Å). That is, a distance t5 from the top surface of the conduction layer 510 to the top surface of the dielectric layer 503 may be in a range of approximately 1500 Å to 3000 Å. In order to ensure that the trench 562 is formed through the fourth adhesion layer 544, the depth of the portion of the trench 562 formed in the dielectric layer 503 may be more than 100 Å. That is, a distance t6 from the bottom of each trench 562 to the top surface of the dielectric layer 503 may be larger than 100 Å. However, in order to ensure the bottom of the trench 562 is above the top surface of the conduction layer 510, the depth of the portion of the trench 562 formed in the dielectric layer 503 may be less than 1000 Å. That is, the distance t6 from the bottom of each trench 562 to the top surface of the dielectric layer 503 may be smaller than 1000 Å. Therefore, in one embodiment, the distance t6 from the bottom of each trench 562 to the top surface of the dielectric layer 503 may be in a range of approximately 100 Å to 1000 Å.

Referring to FIG. 24, the memory device may further include a plurality of conductive plugs 530 formed between adjacent portions of the conduction layer 510 and through the isolation layer 504 and the dielectric layer 503. In one embodiment, each conductive plug 530 may include a fifth adhesion layer 531 and a conduction-plug layer 532 covered by the fifth adhesion layer 531.

In one embodiment, the plurality of conductive plugs 530 may protrude from the top surface of the dielectric layer 503, and accordingly, the fourth adhesion layer 544 may cover the top and sidewall surfaces of the protruding portion of each conductive plug 530. Referring to FIG. 26, in one embodiment, a vertical distance t7 from the top surface of the fifth adhesion layer 531 to the top surface of the dielectric layer 503 may be less than 600 Å.

In one embodiment, the memory device may be a 3D NAND memory device, and correspondingly, referring to FIG. 24, the memory device may also include a stack structure (not labeled) formed by a plurality of interlayer dielectric layers 511 and a plurality of conductive layers 512. The plurality of interlayer dielectric layers 511 and the plurality of conductive layers 512 may be arranged alternately along a direction perpendicular to the substrate 500. Moreover, the memory device may include a staircase structure (not labeled) of a memory array formed in the stack structure. The staircase structure may include a plurality of stairs (not labeled), and each stair may contain one or more pairs of an interlayer dielectric layer 511 and a conductive layer 512, and a conductive layer 512 may be exposed at the surface of each stair. In addition, the memory device may further include a plurality of channels 520 formed through the stack structure. Each channel 520 may further include, from outer shell towards the center, a charge trapping layer 521, a tunneling layer 522 and a channel layer 523. Further, the memory device may further include a plurality of word line contacts 535 formed through the isolation layer 504 and connected to the plurality of stairs. Each word line contact 535 may include a sixth adhesion layer 537 and a word-line conduction layer 536 covered by the sixth adhesion layer 537.

It should be noted that the memory device may also include other components, such as bit line contacts, etc., according to various 3D memory devices in existing memory technology.

It should be noted that as shown in FIG. 24, the memory array of the 3D memory device includes the isolation layer 504, the stack structure, the conduction layer 510, the plurality of word line contacts 535, and/or the plurality of channels 520. For example, the memory array includes a core memory-array structure. The core memory-array structure includes the plurality of channels 520 formed through the stack structure. The plurality of channels 520 is further connected to the conduction layer 510. The plurality of word line contacts 535 is formed in the isolation layer 504, and electrically connects the stairs of the staircase structure with the peripheral circuits 410 formed in the first substrate 400.

Compared to existing 3D memory devices, the disclosed memory device is fabricated by processing memory arrays and peripheral circuits on separate wafers (e.g. an array wafer and a peripheral-circuit wafer), and then bonded the two wafers together for pad-out processing. Further, the substrate of the array wafer is removed after wafer bonding, such that forming TSCs may be unnecessary for pad-out processing. Therefore, the fabrication process may be simplified. In addition, the disclosed memory device has a reduced thickness, which is also conducive to the miniaturization of 3D memory devices.

Further, according to the disclosed method, a first dielectric layer made of silicon nitride can serve as a stop layer when forming a plurality of conductive-plug holes prior to forming the plurality of conductive plugs. The first dielectric layer can also serve as a stop layer when removing the substrate of the array wafer. Moreover, the first dielectric layer can also provide protection for the plurality of conductive plugs when performing a nickel silicide process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory device, comprising:
    a memory array, comprising a staircase structure and an isolation layer, disposed over a substrate of a peripheral-circuit structure along a surface of the substrate;
    a conductive plug, extending through the isolation layer of the memory array and connected to the peripheral-circuit structure;
    a dielectric layer, disposed over the memory array; and
    a conductive pad layer, disposed over the dielectric layer and including a plurality of conductive pads spaced apart from each other, wherein:
        the conductive plug protrudes into a corresponding conductive pad of the plurality of conductive pads,
        the memory array further includes a conduction layer between the staircase structure and the dielectric layer,
        adjacent conductive pads are separated by a trench formed through the conductive pad layer and further partially through the dielectric layer, and a bottom of the trench partially overlaps with the conduction layer, along a thickness direction of the dielectric layer.

2. The memory device according to claim 1, wherein:
the memory array further includes a plurality of word line contacts, and interleaved dielectric layers and conductive layers, wherein edges of the interleaved dielectric layers and conductive layers define the staircase structure;
the conduction layer includes discrete conductive portions;
the conductive plug is between adjacent conductive portions; and
each of the plurality of word line contacts is connected to a corresponding stair of the staircase structure and located between the corresponding stair and the substrate.

3. The memory device according to claim 1, wherein:
a sidewall of an upper portion of the conductive plug is electrically connected to the corresponding conductive pad of the plurality of conductive pads.

4. The memory device according to claim 2, further including:
the conductive pad layer fills a first through hole formed in the dielectric layer to electrically connect the conduction layer; and
the conductive plug is formed through the dielectric layer.

5. The memory device according to claim 4, further including:
a first adhesion layer disposed between the dielectric layer and each conductive pad of the plurality of conductive pads; and
a nickel silicide layer formed on the conduction layer at a bottom of the first through hole, wherein:
the first adhesion layer covers the nickel silicide layer, and
the first adhesion layer is electrically connected with the conductive plug and the conduction layer.

6. The memory device according to claim 1, wherein:
the conductive plug includes a second adhesion layer and a conductive-plug layer covered by the second adhesion layer, wherein:
the second adhesion layer is made of titanium nitride ($TiN_x$), tantalum nitride ($TaN_x$), or a combination thereof, and
the conductive-plug layer is made of a metal, including tungsten (W), copper (Cu), cobalt (Co), aluminum (Al), titanium (Ti), titanium nitride ($TiN_x$), tantalum (Ta), tantalum nitride ($TaN_x$), ruthenium (Ru), or a combination thereof.

7. The memory device according to claim 1, wherein:
a vertical distance from a top surface of the conduction layer to the top surface of the dielectric layer is in a range of approximately 1500 Å to 3000 Å; and
a vertical distance from a bottom surface of the trench to the top surface of the dielectric layer is in a range of approximately 100 Å to 1000 Å.

8. The memory device according to claim 5, wherein:
the first adhesion layer is made of titanium;
the conductive pad layer is made of aluminum;
a thickness of the first adhesion layer is in a range of approximately 50 Å to 300 Å; and
a thickness of the conductive pad layer is in a range of approximately 3000 Å to 10000 Å.

9. The memory device according to claim 1, wherein:
the conduction layer is made of polycrystalline silicon.

10. The memory device according to claim 1, wherein:
the memory array further includes a channel formed vertically through the staircase structure, wherein:
the channel includes a charge trapping layer, a tunneling layer, and a channel layer.

11. The memory device according to claim 2, wherein:
each word line contact of the plurality of word line contacts includes a third adhesion layer and a word-line conduction layer covered by the third adhesion layer, wherein:
the third adhesion layer is made of titanium nitride ($TiN_x$), tantalum nitride ($TaN_x$), or a combination thereof; and
the word-line conduction layer is made of a metal, including tungsten (W), copper (Cu), cobalt (Co), aluminum (Al), titanium (Ti), titanium nitride ($TiN_x$), tantalum (Ta), tantalum nitride ($TaN_x$), ruthenium (Ru), or a combination thereof.

12. The memory device according to claim 1, further comprising:
multiple conductive plugs of the conductive plug extending through the isolation layer of the memory array and connected to the peripheral-circuit structure, wherein
the multiple conductive plugs protrude into a same conductive pad of the plurality of conductive pads, the same conductive pad encapsulating each of the conductive plugs.

13. A method for forming a memory device, comprising:
providing a bonded structure, including:
a memory array, comprising a staircase structure and an isolation layer, disposed over a substrate of a peripheral-circuit structure along a surface of the substrate, and
a conductive plug extending through the isolation layer of the memory array and connected to the peripheral-circuit structure, wherein a portion of the conductive plug protrudes from a top surface of the memory array;
forming a first dielectric layer, over the memory array; and
forming a conductive pad layer over the first dielectric layer, wherein:
the conductive pad layer includes a plurality of conductive pads spaced apart from each other, and
the portion of the conductive plug protruding from the top surface of the memory array is covered by a corresponding conductive pad of the plurality of conductive pads, wherein
the memory array further includes a conduction layer between the staircase structure and the first dielectric layer,
adjacent conductive pads are separated by a trench formed through the conductive pad layer and further partially through the first dielectric layer, and
along a thickness direction of the first dielectric layer, a bottom of the trench partially overlaps with the conduction layer.

14. The method according to claim 13, wherein:
the memory array further includes a plurality of word line contacts, and interlayer dielectric layers and conductive layers that are alternately arranged to form the staircase structure,
the conduction layer includes discrete conductive portions,
the conductive plug is between adjacent conductive portions, and each of the plurality of word line contacts is connected to a corresponding stair of the staircase structure and located between the corresponding stair and the substrate; and wherein the conductive plug protrudes from a top surface of the first dielectric layer; and the method further includes forming a first through hole in the first dielectric layer to expose a portion of the conduction layer prior to forming the conductive pad layer, wherein the conductive pad layer covers the top surface of the first dielectric layer and sidewall and bottom surfaces of the first through hole.

15. The method according to claim 13, wherein:
the memory array further includes a plurality of word line contacts, each connected to a corresponding stair of the staircase structure and located between the corresponding stair and the substrate;
the bonded structure further includes:
   a second dielectric layer, formed over the first dielectric layer, wherein the conductive plug is partially formed through the second dielectric layer, and
   a second substrate, located above the second dielectric layer; and
the method further includes:
   removing the second substrate prior to forming the first through hole,
   when forming the first through hole to expose the portion of the conduction layer, forming the first through hole through the second dielectric layer and the first dielectric layer to expose the portion of the conduction layer, and
   after forming the first through hole, removing the second dielectric layer.

16. The method according to claim 14, further including:
forming, prior to forming the conductive pad layer, a first adhesion layer on the top surface of the first dielectric layer, the sidewall and bottom surfaces of the first through hole, and sidewall and top surfaces of a portion of the conductive plug located above the first dielectric layer, wherein the trench is further formed through the first adhesion layer.

17. The method according to claim 14, prior to forming the conductive pad layer, further including:
forming a nickel silicide layer on the conduction layer exposed at a bottom of the first through hole.

18. The method according to claim 15, wherein, prior to removing the second dielectric layer:
a vertical distance from a top surface of the conductive plug to the top surface of the first dielectric layer is less than 600 Å; and
a vertical distance from the top surface of the conductive plug to the top surface of the second dielectric layer is greater than 400 Å.

19. The method according to claim 16, wherein:
a vertical distance from a top surface of the conduction layer to a top surface of the first dielectric layer is in a range of approximately 1500 Å to 3000 Å; and
a vertical distance from a bottom surface of the trench to the top surface of the first dielectric layer is in a range of approximately 100 Å to 1000 Å.

20. The method according to claim 16, wherein:
the first adhesion layer is made of titanium;
the conductive pad layer is made of aluminum;
a thickness of the first adhesion layer is in a range of approximately 50 Å to 300 Å; and
a thickness of the conductive pad layer is in a range of approximately 3000 Å to 10000 Å.

* * * * *